United States Patent [19]

Ahlquist et al.

[11] 4,374,915

[45] Feb. 22, 1983

[54] HIGH CONTRAST ALIGNMENT MARKER FOR INTEGRATED CIRCUIT FABRICATION

[75] Inventors: C. Norman Ahlquist, Menlo Park; Yaw Wen Hu, San Jose; Peter F. Schoen, Redwood City Marina; Paul A. Poenisch, Santa Clara, all of Calif.

[73] Assignee: Intel Corporation, Santa Clara, Calif.

[21] Appl. No.: 288,519

[22] Filed: Jul. 30, 1981

[51] Int. Cl.³ .................... G03F 9/00; G03C 11/00
[52] U.S. Cl. ........................... 430/22; 430/312; 430/313; 430/316; 156/644; 156/646
[58] Field of Search ............. 430/22, 312, 313, 316; 156/644, 646; 428/156

[56] References Cited

U.S. PATENT DOCUMENTS

| | | | |
|---|---|---|---|
| 3,171,762 | 3/1965 | Rutz | 156/644 |
| 3,783,044 | 1/1974 | Cheskis et al. | 148/175 |
| 3,787,275 | 1/1974 | Grenma | 428/156 |
| 3,802,940 | 4/1974 | Villers et al. | 148/187 |
| 4,106,976 | 8/1978 | Chiou et al. | 156/644 |
| 4,233,091 | 11/1980 | Kawabe | 148/175 |

OTHER PUBLICATIONS

Brownlow, IBM Tech. Dis. Bul., vol. 21, No. 3, Aug. 1978.
Doo, IBM Tech. Dis. Bul., vol. 23, No. 7A, Dec. 1980.

*Primary Examiner*—Michael R. Lusignan
*Assistant Examiner*—Richard Bueker
*Attorney, Agent, or Firm*—Blakely, Sokoloff, Taylor and Zafman

[57] ABSTRACT

A wafer marker is described for aligning masks with the wafer. The marker comprises a depression in the wafer which is defined by sloped sides and a pitted bottom. The sloped sides and pitted bottom do not directly reflect light as does the surface of the surrounding silicon and thus the marker appears as a darker region. The bottom of the depression is pitted by exposing the anode during a silicon plasma etching step.

5 Claims, 8 Drawing Figures

HIGH CONTRAST ALIGNMENT MARKER FOR INTEGRATED CIRCUIT FABRICATION

BACKGROUND OF THE INVENTION

1. Field of the Invention

The invention relates to the field of mask alignment techniques for integrated circuit fabrication.

2. Prior Art

In recent years, the advances in integrated circuit lithography have enabled the fabrication of much higher density circuits. The masking steps used today for these circuits bear little resemblance to the contact masking technique commonly used ten years ago.

Currently, one of the more commonly employed masking techniques is the "projection system." An integrated circuit master pattern is projected onto the wafer and stepped from location-to-location until the entire wafer is exposed. In some cases, the integrated circuit master pattern contains several, for example, four identical patterns, thus four circuits are exposed at each step. These projection systems vary greatly, and in some instances, a one-to-one ratio between the mask pattern and projected image is used; in other cases, the ratio is as high as 10 to 1. For a discussion of direct-step-on-the-wafer masking technique, see "Wafer Steeper Steps Up Yield and Resolution in IC Lithography," *Electronics*, Aug. 16, 1979, beginning at page 109.

When the integrated circuit master pattern of each mask is stepped on the wafer, it must be aligned at each location. This, of course, is necessary to assure proper alignment of the circuit elements in each of the layers. Prior art markers are often fabricated during the initial "front end" steps, and subsequent masks are aligned to these markers. Frequently, these markers consist of openings in a field-oxide layer.

During the alignment, the wafer is covered with a photoresist (generally of uneven thickness). The markers are sighted visually through the photoresist layer and the projected image from the mask is then aligned to the markers. Once this is done, the photoresist can be exposed through the mask, to "transfer" the mask pattern to the photoresist.

The manual alignment systems which use multi-wavelength light work fairly well with prior art markers. The multi-wavelength light is not extinguished by interference patterns which occur in the photoresist layer, making it easier to align to the markers. A problem occurs, however, where a single wavelength of light (or a narrow band of wavelengths) are used. Then, extinction reduces the contrast, making it difficult to align to the markers. This is particularly a problem with automatic alignment systems.

As will be seen, the present invention provides a new marker which is particularly useful with automatic alignment, projection systems using a single wavelength or narrow band of light for alignment (e.g., green or yellow).

SUMMARY OF THE INVENTION

An improved marker is described for use in the fabrication of integrated circuits where radiation is passed through a masking member to expose regions of a photosensitive layer disposed on a wafer or substrate. A depression with sloped sides is formed in the substrate; the sides extend from the surface of the substrate to the bottom region of the depression. The bottom region of the depression is pitted in the presently preferred embodiment. The radiation used for aligning the masking member is reflected from the sloped sides in a different direction than radiation incident on the flat surface of the substrate. The marker thus provides a high contrast. The pitted bottom surface of the marker scatters or absorbs the radiation, further adding to the contrast.

DETAILED DESCRIPTION OF THE INVENTION

An improved marker for marking a wafer to permit the alignment of masks with the wafer is described. In the following description, numerous specific details are set forth, such as specific dimensions in order to provide a thorough understanding of the present invention. It will be obvious, however, to one skilled in the art that the present invention may be practiced without these specific details. In other instances, well-known processing steps have not been described in detail in order not to obscure the present invention in unnecessary detail.

The invented marker is used in the fabrication of metal-oxide-semiconductor (MOS) circuits, although it can be used with equal success in bipolar processing. As currently implemented, the markers are used with automatic aligning, advanced wafer steppers, such as the Ultratech 900 or the Censor SRA-100.

Figure 1:
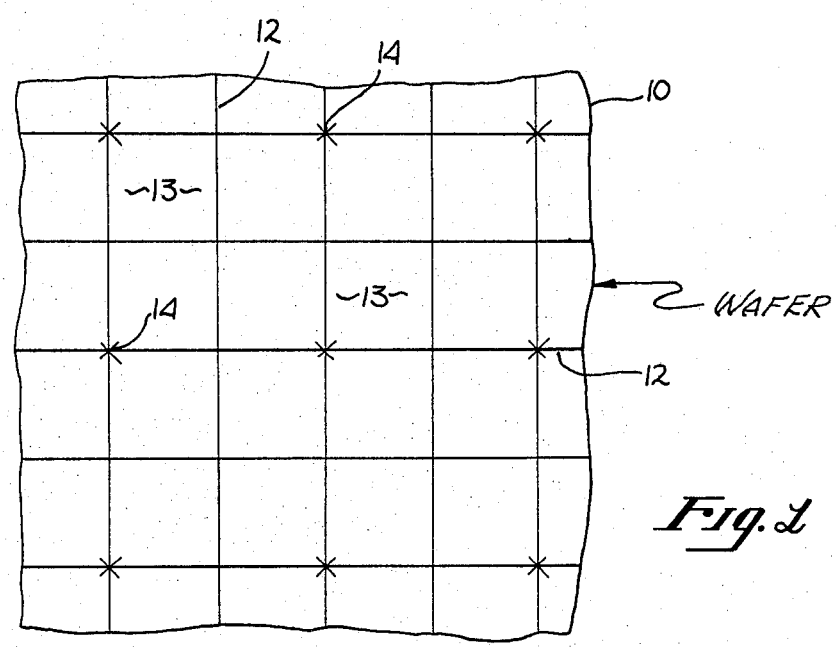
FIG. 1 is a plan view of a wafer used to illustrate the locations of markers on a wafer.
Figure 2:
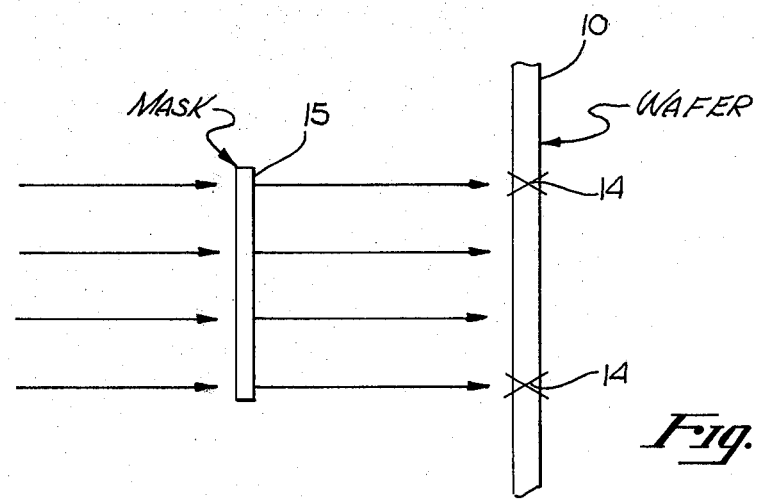
FIG. 2 is a diagram illustrating a projection masking system.

Referring first to FIG. 1, a portion of a wafer 10 is shown along with the grid 12 (commonly referred to as "streets") which separate the circuits 13 being fabricated on the wafer. Marker locations 14 are shown disposed in the streets about every four circuits. As shown in FIG. 2, a mask 15 is aligned with the markers thereby allowing the photoresist on the wafer to be selectively exposed. The mask 15 is stepped and aligned with adjacent markers so that the entire wafer can be exposed through the mask 15. The markers are used to align the mask for each masking step except for the first marking step when the markers themselves are formed. (Note in FIG. 1 four circuits 13 are shown within each four markers, in some cases depending upon the substrate area required for each circuit, fewer or more circuits are exposed during each step).

As mentioned, in the prior art the markers are fabricated during the marking step used to define the field oxide regions. As will be seen with the present invention a new mask is used for the fabrication of the markers.

Figure 3:
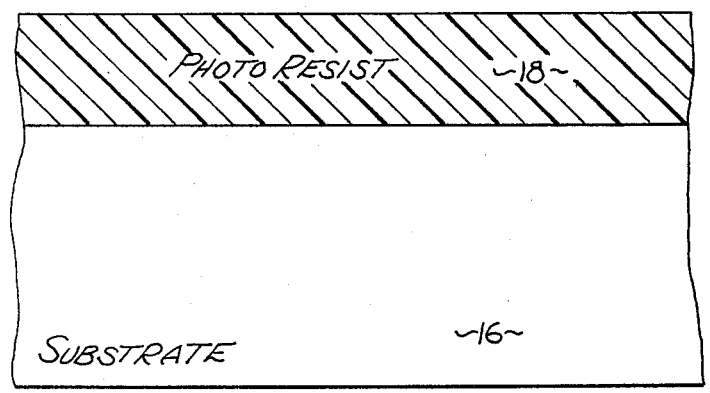
FIG. 3 is a cross-sectional elevation view of a substrate which includes a photoresist layer.
Figure 4:
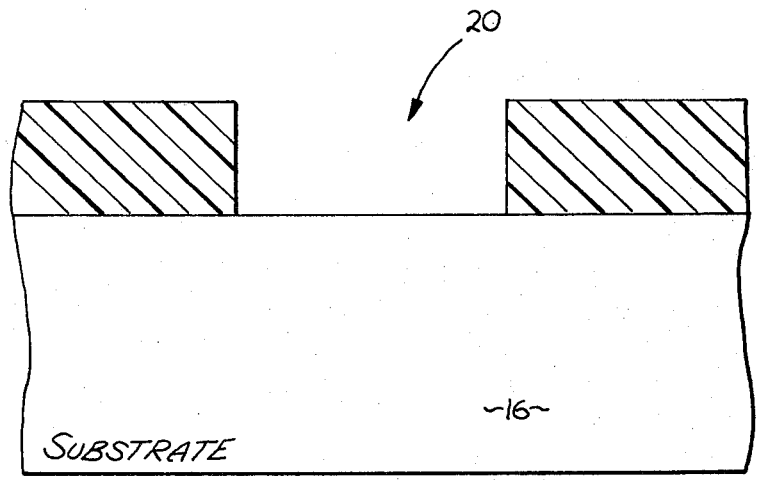
FIG. 4 illustrates the substrate of FIG. 3 after an opening has been formed through the photoresist layer.

Referring now to FIG. 3, with the present invention, prior to the fabrication of any of the circuit elements, a photoresist layer 18 is formed over the wafer (shown as substrate 16). (The words substrate and wafer are used interchangeably in this disclosure.) An opening 20 is then formed through the photoresist layer at the site of each of the proposed markers. In the presently preferred embodiment, each of these openings are approximately 5 microns wide and 50–200 microns in length (although the dimensions are not critical). The openings 20 are formed using an ordinary masking step, note for this very first masking step alignment is not critical since all the subsequent masks will be aligned to the markers formed at the openings 20. Ordinary masking and etching steps are used to form the openings 20. However, the mask used to form the openings 20 is unusual in that its sole function is to define the markers.

Figure 5:
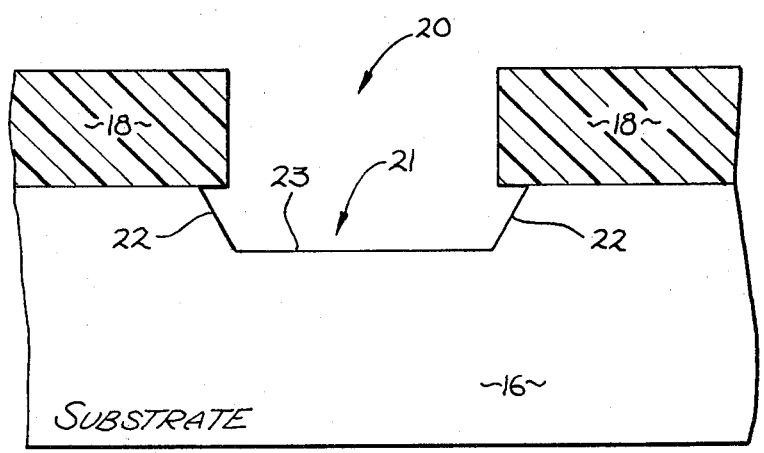
FIG. 5 illustrates the substrate of FIG. 4 after an isotrophic etchant has been used to form a depression in the substrate.

Now, as shown in FIG. 5, the substrate is subjected to a wet isotropic etchant suitable for etching the substrate 16. At the opening 20, a depression 21 is formed in the substrate. Since the etchant used is an isotropic etchant, sloped sides 22 are formed on the sides of the depression 21. These sloped sides extend from the surface of the substrate to the bottom surface 23 of the depression. In the presently preferred embodiment, the depression 21 is approximately 1 micron deep.

Figure 6:
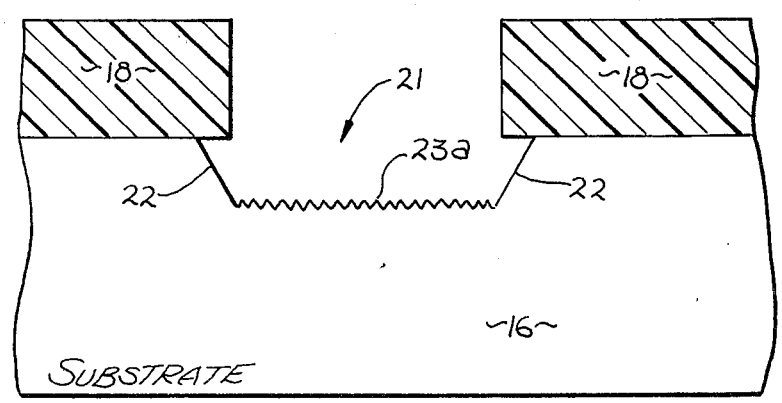
FIG. 6 illustrates the substrate of FIG. 5 after the bottom surface of the depression has been pitted.

In the next step, the bottom surface 23 of the depression is pitted or otherwise roughened. The pitted surface 23a as shown in FIG. 6, as will be described, reduces reflection from the bottom of the depression since incident light is scattered or absorbed.

In the presently preferred embodiment, the surface 23 of FIG. 5 is pitted by using a modified plasma etching step. Typicallly, during a plasma etching step for the etching of silicon, the aluminum anode is covered to prevent aluminum contamination. In the presently preferred process, the anode is unprotected and aluminum from the anode is allowed to sputter onto the substrate and in particular into the bottom of the depression 21. Small regions of aluminum are thus formed in the bottom. This aluminum acts as a local mask while the plasma etching process etches the silicon surrounding these small aluminum regions. After this modified etching step, the photoresist is removed and the wafer is cleaned with $H_2SO_4$ and $H_2O_2$ to remove trace metal contaminants. The resultant structure consists of a pitted bottom (surface 23a).

Figure 7:
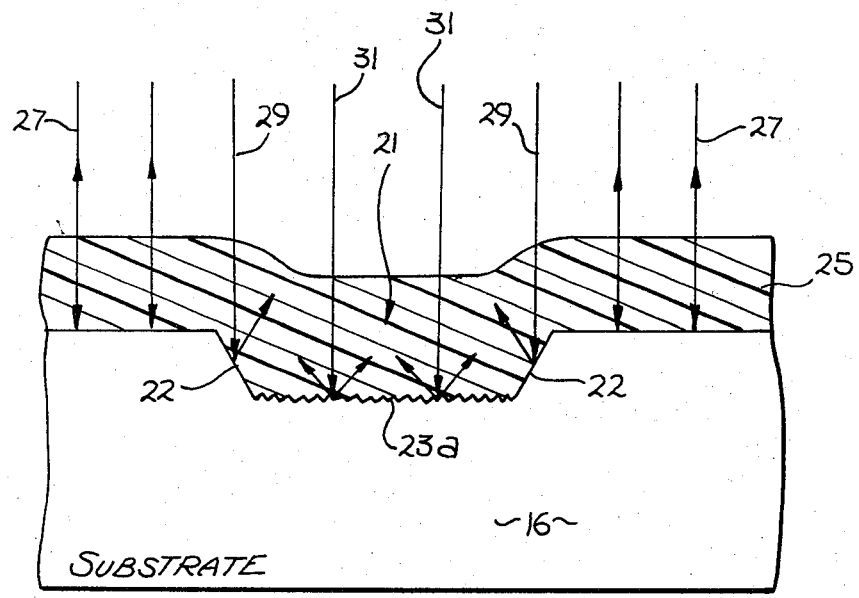
FIG. 7 illustrates the substrate of FIG. 6 after a photoresist layer has been formed over the substrate, including the depression.

Now referring to FIG. 7, the substrate 16 is shown with another layer of photoresist 25. In the utilization of the depression 21, it is best if subsequent photoresist layers are relatively uniform in thickness. Also the thickness of these layers should be selected such that for the particular wavelength of radiation used to align the masks, interference does not occur between the light incident on the photoresist and the light reflected from the surface of the silicon. Maximum direct reflection is thus obtained from the light incident on the surface of the silicon surrounding the depression 21. This is illustrated in FIG. 7 by the lines 27.

The light incident on the sloped sides 22 of depression 21 is reflected away from the line of the incoming light. Thus, when the depression is viewed, the sloped edges appear darker. This is indicated by the lines 29 of FIG. 7. Finally, the light incident on the bottom surface 23a because of the pitting, tends to scatter or be absorbed because of the multiple internal reflections. This is indicated by lines 31 of FIG. 7.

When the depression 21 of FIG. 7 is viewed, there is substantial contrast between the depression 21 (forming the marker) and the surrounding substrate surface. The marker in effect appears as a "dark" region.

Figure 8:
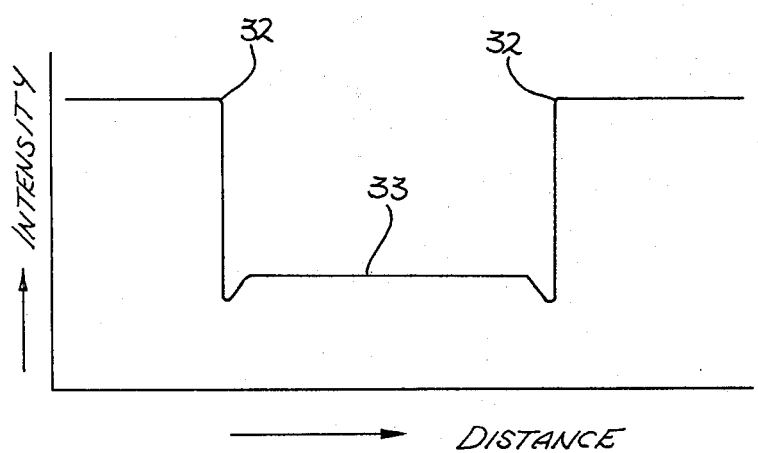
FIG. 8 is a graph used to illustrate the intensity of light reflected from the substrate in the region of the invented marker.

As shown in FIG. 8, the intensity of the light reflected from the marker is substantially less than the intensity of the light reflected from the surrounding substrate surface. The beginning of the sloped sides 22 is shown by the points 32 of the graph of FIG. 8. At these points the intensity of the directly reflected light drops considerably. The intensity is also relatively low from the bottom of the depression as indicated by segment 33 of the graph.

Thus, an improved marker has been described and a process for fabricating the marker. The marker comprises a depression in the silicon with sloped sides and a pitted bottom. Light incident on the marker (through a photoresist layer) is not directly reflected as is light incident on the surrounding surfaces of the substrate, and thus, the marker appears as a contrasting region. Substantially better contrast is obtained between the invented marker and prior art markers.

We claim:

1. In the fabrication of integrated circuits on a substrate wherein radiation is passed through a masking member to expose certain regions of a photosensitive layer, a process for forming an improved marker for permitting better alignment between said masking member and said substrate, comprising the steps of:
    forming a photoresist layer on said substrate;
    forming an opening in said layer at the proposed site of said marker;
    etching a depression in said substrate in said substrate at said opening, said depression including sloped sides and a generally planer bottom region;
    roughening said bottom region such that said bottom region directly reflects less radiation than said substrate surface;
    whereby a high contrast marker for use in aligning said masking member with said substrate is formed.

2. The process defined in claim 1 wherein a isotropic etchant is used in said etching step.

3. The process defined by claim 2 including the steps of removing said photoresist layer from said substrate and forming a second photoresist layer which covers said depression, said second layer having a uniform thickness over said surface of said substrate.

4. The process defined by claim 1 wherein the step of pitting said bottom region comprises subjecting said substrate to a plasma etching step for etching with an exposed anode electrode.

5. In the fabrication of integrated circuits on a substrate wherein radiation is passed through a masking member to expose certain regions of a photosensitive layer, a process for forming an improved contrast marker for permitting better alignment between said masking member and said substrate, comprising the steps of:
    forming a photoresist layer on said substrate;
    forming an opening on said layer at the proposed site of said marker;
    etching a depression in said substrate at said opening, said depression including sloped sides and a generally planer bottom region;
    roughening said bottom region such that said bottom region directly reflects less radiation than said substrate surface;
    removing said photoresist layer from said substrate;
    forming a second photoresist layer which covers said depression, said second layer having a uniform thickness over said surface of said substrate;
    whereby a high contrast marker for use in aligning said masking member with said substrate is formed.

* * * * *